(12) United States Patent
Bae et al.

(10) Patent No.: US 12,248,024 B2
(45) Date of Patent: Mar. 11, 2025

(54) BATTERY CLASSIFICATION APPARATUS AND METHOD

(71) Applicant: LG Energy Solution, Ltd., Seoul (KR)

(72) Inventors: Yoon-Jung Bae, Daejeon (KR); A-Ming Cha, Daejeon (KR); Hyun-Woo Park, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 208 days.

(21) Appl. No.: 17/925,928

(22) PCT Filed: Jan. 25, 2022

(86) PCT No.: PCT/KR2022/001332
§ 371 (c)(1),
(2) Date: Nov. 17, 2022

(87) PCT Pub. No.: WO2022/158949
PCT Pub. Date: Jul. 28, 2022

(65) Prior Publication Data
US 2023/0184843 A1    Jun. 15, 2023

(30) Foreign Application Priority Data

Jan. 25, 2021 (KR) .................. 10-2021-0010309

(51) Int. Cl.
G01R 31/3835 (2019.01)
G01R 31/396 (2019.01)
H01M 10/48 (2006.01)

(52) U.S. Cl.
CPC ....... G01R 31/3835 (2019.01); G01R 31/396 (2019.01); H01M 10/48 (2013.01)

(58) Field of Classification Search
CPC .............. G01R 31/3835; G01R 31/396; G01R 31/392; G01R 31/3648; G01R 19/16542;
(Continued)

(56) References Cited

U.S. PATENT DOCUMENTS

2002/0196025 A1* 12/2002 Freeman .............. G01R 31/389
324/426
2011/0012604 A1* 1/2011 Tsujiko ............... H01M 4/5825
324/427
(Continued)

FOREIGN PATENT DOCUMENTS

CN         102468521 A  *  5/2012  ........ H01M 10/0525
CN         107636885 A  *  1/2018  ......... B60L 11/1864
(Continued)

OTHER PUBLICATIONS

International Search Report for Application No. PCT/KR2022/001332 mailed May 18, 2022, pp. 1-3.
(Continued)

*Primary Examiner* — Tung X Nguyen
*Assistant Examiner* — Robert P Alejnikov, Jr.
(74) *Attorney, Agent, or Firm* — Lerner David LLP

(57) ABSTRACT

A battery classification apparatus includes a profile generating unit configured to obtain battery information about capacity and voltage of a battery and generate a differential profile representing a corresponding relationship between the capacity and a differential voltage based on the capacity and the voltage, and a control unit configured to obtain the differential profile from the profile generating unit, detect a plurality of peaks in the obtained differential profile, and classify the battery into any one of a plurality of preset groups based on a plurality of classification conditions preset for the number of the plurality of detected peaks and the differential voltage.

10 Claims, 5 Drawing Sheets

(58) Field of Classification Search
CPC ........... G01R 19/16566; G01R 31/382; H01M 10/48; Y02E 60/10
USPC .................... 324/117 R, 117 H, 126, 127
See application file for complete search history.

(56) References Cited

U.S. PATENT DOCUMENTS

| | | | |
|---|---|---|---|
| 2012/0032647 A1* | 2/2012 | Watanabe | H01M 4/587 |
| | | | 320/136 |
| 2016/0061908 A1* | 3/2016 | Torai | G01R 31/3648 |
| | | | 702/63 |
| 2016/0254687 A1* | 9/2016 | Tanaka | H01M 10/425 |
| | | | 320/112 |
| 2017/0212170 A1* | 7/2017 | Torai | H01M 10/482 |
| 2020/0271727 A1* | 8/2020 | Bae | H01M 10/42 |
| 2020/0366115 A1* | 11/2020 | Kim | H01M 10/425 |
| 2020/0393518 A1* | 12/2020 | Takegami | G01R 31/392 |
| 2021/0046844 A1 | 2/2021 | Bae et al. | |
| 2021/0167432 A1 | 6/2021 | Han et al. | |
| 2022/0390524 A1 | 12/2022 | Takegami | |

FOREIGN PATENT DOCUMENTS

| | | | |
|---|---|---|---|
| CN | 109659641 A | 4/2019 | |
| EP | 3196663 A1 * | 7/2017 | ........... G01R 31/367 |
| EP | 3835802 A1 | 6/2021 | |
| EP | 3913385 A1 | 11/2021 | |
| JP | 3014303 B2 | 2/2000 | |
| JP | 2012055043 A | 3/2012 | |
| JP | 5033262 B2 | 9/2012 | |
| JP | 2016053564 A | 4/2016 | |
| JP | 6123844 B2 | 5/2017 | |
| JP | 6192738 B2 | 9/2017 | |
| JP | 6490882 B1 | 3/2019 | |
| JP | 6493762 B2 | 4/2019 | |
| JP | 2020532272 A | 11/2020 | |
| JP | 6818947 B1 | 1/2021 | |
| KR | 20190118529 A | 10/2019 | |
| KR | 20200018308 A | 2/2020 | |
| KR | 20200122111 A | 10/2020 | |
| KR | 20200131629 A | 11/2020 | |

OTHER PUBLICATIONS

Extended European Search Report including Written Opinion for Application No. 22742925.5 dated Oct. 18, 2023, pp. 1-8.

* cited by examiner

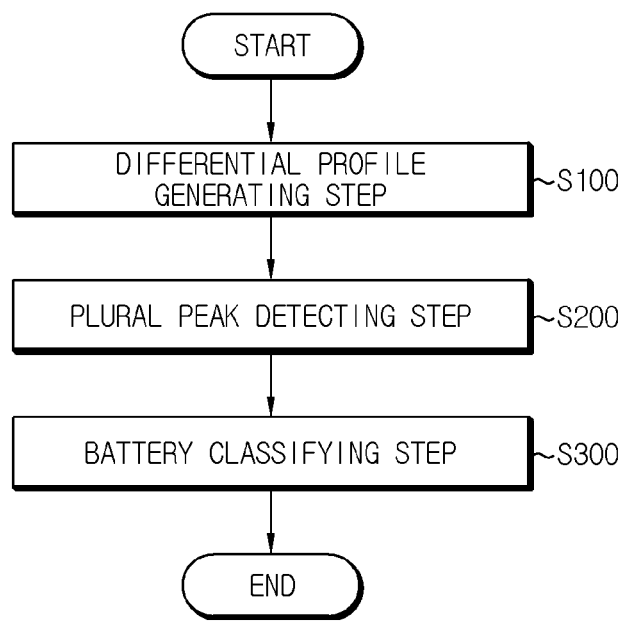

BATTERY CLASSIFICATION APPARATUS AND METHOD

CROSS-REFERENCE TO RELATED APPLICATION

The present application is a national phase entry under 35 U.S.C. § 371 of International Application No. PCT/KR2022/001332 filed on Jan. 25, 2022, which claims priority from Korean Patent Application No. 10-2021-0010309 filed Jan. 25, 2021, all of which are incorporated herein by reference.

TECHNICAL FIELD

The present disclosure relates to a battery classification apparatus and method, and more particularly, to a battery classification apparatus and method capable of classifying a battery based on capacity and voltage of the battery.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

In general, a battery may be classified according to a negative electrode material or a positive electrode material included therein.

For example, the battery may be classified into a battery containing 100% graphite-based negative electrode material, a battery containing graphite and non-graphite-based negative electrode material, or a battery containing 100% non-graphite-based negative electrode material.

For reference, the battery may be classified into a battery containing an NMCO (nickel manganese cobalt oxide) positive electrode material, a battery containing NMCO and non-NMCO positive electrode material, or a battery containing a non-NMCO positive electrode material. Here, N refers to nickel (Ni), M refers to manganese (Mn), C refers to cobalt (Co), and O refers to oxide. More specifically, according to the content of N contained in the NMCO positive electrode material, the battery may be classified into a high nickel-based battery and a low nickel-based battery. For example, when the content of N is 70% or more, the battery may be classified into a high nickel-based battery.

Since battery characteristics may vary depending on the type of negative electrode material contained in the battery, it is important to control the battery to correspond to the type of negative electrode material. To this end, first, it is necessary to determine the type of negative electrode material included in the battery, but the prior art, there is a problem in that the negative electrode material must be directly identified after disassembling the battery. In addition, it may be impossible to reuse the battery due to the occurrence of cracks in the process of disassembling the sealed battery, and much cost and time may be consumed in reassembling the disassembled battery. Therefore, there is a need to develop a technology to classify a battery in a non-destructive way.

SUMMARY

Technical Problem

The present disclosure is designed to solve the problems of the related art, and therefore the present disclosure is directed to providing a battery classification apparatus and method capable of classifying a battery in a non-destructive way based on voltage and capacity of the battery.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery classification apparatus according to one aspect of the present disclosure may comprise: a controller; and memory having programmed thereon instructions that, when executed, are configured to cause the processor to: obtain a differential profile representing a relationship between a capacity of a battery and a differential voltage of the battery; detect a plurality of peaks in the obtained differential profile; and classify the battery into any one of a plurality of preset groups based on a plurality of preset classification conditions, wherein the classification conditions are conditioned on a total number of the plurality of detected peaks and the differential voltage associated with each detected peak.

The plurality of classification conditions may include: a first classification condition about whether any of the plurality of peaks in a first capacity region of the differential profile is associated with a differential voltage that is equal to or greater than a threshold value; and a second classification condition about whether any of the plurality of peaks in a second capacity region of the differential profile is associated with a differential voltage that is equal to or greater than the threshold value.

The first capacity region and the second capacity region may be based on a capacity at which a corresponding differential voltage is lowest within a predetermined capacity region of the differential profile.

The instructions may be configured to cause the controller to determine a target peak from among the plurality of peaks at which the differential voltage is greatest, determine a first differential voltage based on the differential voltage of the determined target peak, determine a second differential voltage based on a lowest differential voltage of the differential profile, and set the threshold value to a greater one of (i) the first differential voltage or (ii) the second differential voltage.

The first differential voltage may be smaller than the differential voltage of the target peak by a first reference value and second differential voltage may be greater than the lowest differential voltage by a second reference value.

The instructions may be configured to cause the controller to classify the battery into a first group in response to the battery satisfying both the first classification condition and the second classification condition.

The instructions may be configured to cause the controller to classify the battery into a second group in response to the battery not satisfying at least one of the first classification condition and the second classification condition.

The instructions may be configured to cause the controller to determine that the battery is a beginning of life (BOL) battery containing a graphite-based negative electrode material or a middle of life (MOL) battery containing a graphite-based negative electrode material based on classification of the battery into the first group.

The instructions may be configured to cause the controller to determine that the battery is a battery containing a non-graphite-based negative electrode material or an end of life (EOL) battery containing a graphite-based negative electrode material based on classification of the battery into the second group.

The instructions may be configured to cause the controller to determine that the battery is a reusable battery based on classification of the battery into the first group and determine that the battery is a non-reusable battery based on classification of the battery into the second group.

A battery pack according to another aspect of the present disclosure may comprise the battery classification apparatus according to any of the embodiments of the present disclosure.

A battery classification method according to still another aspect of the present disclosure may comprise: obtaining, by a controller, a differential profile representing a corresponding relationship between a differential voltage of a battery and a capacity of the battery; detecting, by the controller, a plurality of peaks in the differential profile; and classifying, by the controller, the battery into any one of a plurality of preset groups based on a plurality of preset classification conditions, wherein the classification conditions are conditioned on a total number of the plurality of detected peaks and the differential voltage associated with each detected peak.

Advantageous Effects

According to one aspect of the present disclosure, the battery classification apparatus has an advantage of classifying a battery a non-destructive way according to the type of negative electrode material and the state of the battery. Furthermore, the battery classification apparatus has an advantage of more specifically classifying the battery into a reusable battery or a non-reusable battery.

The effects of the present disclosure are not limited to the effects mentioned above, and other effects not mentioned will be clearly understood by those skilled in the art from the description of the claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 7 is a diagram schematically showing a battery classification method according to still another embodiment of the present disclosure.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
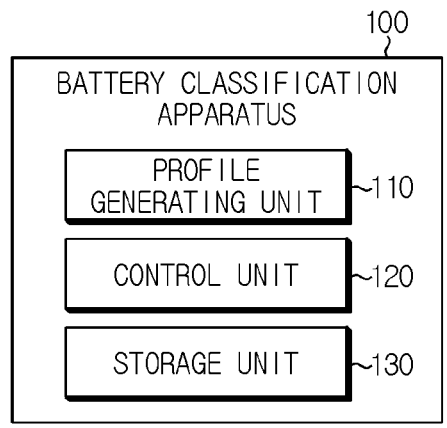
FIG. 1 is a diagram schematically showing a battery classification apparatus according to an embodiment of the present disclosure.

FIG. 1 is a diagram schematically showing a battery classification apparatus 100 according to an embodiment of the present disclosure.

Referring to FIG. 1, the battery classification apparatus 100 according to an embodiment of the present disclosure may include a profile generating unit 110 and a control unit 120.

The profile generating unit 110 may be configured to obtain battery information about capacity and voltage of a battery.

Here, the battery means one physically separable independent cell including a negative electrode terminal and a positive electrode terminal. For example, one lithium-ion battery or lithium polymer battery may be regarded as a battery.

For example, the profile generating unit 110 may obtain a battery profile representing a corresponding relationship between a capacity and a voltage of the battery. That is, the battery profile may include battery information in which the capacity and the voltage of the battery are mapped.

The profile generating unit 110 may be configured to generate a differential profile representing a corresponding relationship between a differential voltage based on capacity and voltage and the capacity.

Here, the differential voltage is a value obtained by differentiating the voltage included in the battery information by the capacity, and may be expressed as "dV/dQ". That is, the differential voltage may be a value representing an instantaneous change rate of voltage with respect to capacity. The differential profile will be described with reference to the embodiment of FIG. 2.

Figure 2:
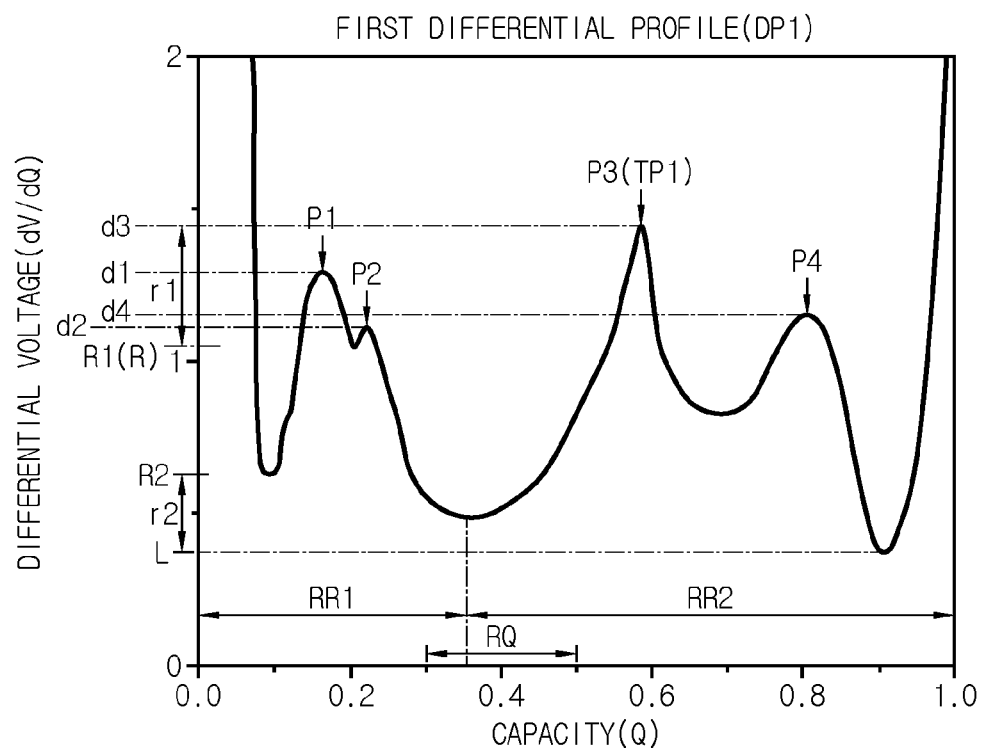
FIG. 2 is a diagram schematically showing a first differential profile according to an embodiment of the present disclosure.

FIG. 2 is a diagram schematically showing a first differential profile DP1 according to an embodiment of the present disclosure.

Specifically, the first differential profile DP1 is a differential profile for a battery containing an NMCO positive electrode material having a nickel content of 80% and a 100% graphite-based negative electrode material. In addition, the first differential profile DP1 is a differential profile generated based on the voltage and capacity of the battery obtained when the battery is charged at a temperature of 25° C. and at a 0.05 C-rate.

In the embodiment of FIG. 2, the profile generating unit 110 may generate the first differential profile DP1 representing a corresponding relationship between the capacity and the differential voltage, based on the obtained battery information. Specifically, in the first differential profile DP1, the capacity of the battery may be normalized to have a capacity region of 0 to 1. For this reason, when the plurality of batteries are classified, the capacity regions for the plurality of batteries are normalized, so that the plurality of batteries may be classified under the same condition.

The control unit 120 may be configured to obtain a differential profile from the profile generating unit 110.

For example, the control unit 120 and the profile generating unit 110 may be connected to communicate with each other. The profile generating unit 110 may transmit the generated first differential profile DP1 to the control unit 120, and the control unit 120 may receive the first differential profile DP1 from the profile generating unit 110.

The control unit 120 may be configured to detect a plurality of peaks in the obtained differential profile.

Here, the peak may be a point having an upward convex form in the differential profile. That is, the peak is a point at which the change rate of the differential voltage with respect to capacity is 0. Based on the peak, the change rate may be positive at a low capacity side, and the change rate may be negative at a high capacity side.

For example, in the first differential profile DP1 according to the embodiment of FIG. 2, the control unit 120 may detect a first peak P1, a second peak P2, a third peak P3, and a fourth peak P4.

The control unit 120 may be configured to classify the battery into any one of a plurality of preset groups based on a plurality of classification conditions preset for the number of the plurality of detected peaks and the differential voltage.

Specifically, the plurality of classification conditions may include a first classification condition and a second classification condition. For example, the first classification condition may be a classification condition about whether a peak at which a corresponding differential voltage is greater than or equal to a criterion value R exists in a first capacity region RR1. In addition, the second classification condition may be a classification condition about whether a peak at which a corresponding differential voltage is greater than or equal to the criterion value R exists in a second capacity region RR2.

For example, in the embodiment of FIG. 2, the first peak P1 and the second peak P2 may be included in the first capacity region RR1, and the third peak P3 and the fourth peak P4 may be included in the second capacity region RR2. Since the differential voltage d1 of the first peak P1 and the differential voltage d2 of the second peak P2 are equal to or greater than the criterion value R, the battery may satisfy the first classification condition. In addition, since the differential voltage d3 of the third peak P3 and the differential voltage d4 of the fourth peak P4 are also equal to or greater than the criterion value R, the battery may satisfy the second classification condition.

The control unit 120 may be configured to classify the battery into a first group, when the battery satisfies both the first classification condition and the second classification condition. Conversely, if the battery does not satisfy at least one of the first classification condition and the second classification condition, the control unit 120 may be configured to classify the battery into a second group.

For example, in the embodiment of FIG. 2, since the battery satisfies both the first classification condition and the second classification condition, it may be classified into the first group.

More specifically, the control unit 120 may be configured to determine the battery classified into the first group as a BOL (Beginning of Life) battery or a MOL (Middle of Life) battery containing a graphite-based negative electrode material. In addition, the control unit 120 may be configured to determine the battery classified into the second group as a battery containing a non-graphite-based negative electrode material or an EOL (End of Life) battery containing a graphite-based negative electrode material.

That is, the control unit 120 may be configured to determine the battery classified into the first group as a reusable battery. Also, the control unit 120 may be configured to determine the battery classified into the second group as a non-reusable battery.

For example, in the embodiment of FIG. 2, the battery classified into the first group may be regarded as a BOL battery or a MOL battery and thus classified as a reusable battery.

In general, a battery containing 100% graphite-based negative electrode material is known to have a relatively long charging/discharging lifespan, compared to a battery containing graphite and a non-graphite-based negative electrode material or a battery containing 100% non-graphite-based negative electrode material. That is, the battery including 100% graphite-based negative electrode material may exhibit high performance efficiency due to a relatively long lifespan even if it is reused.

Therefore, the battery classification apparatus 100 has an advantage of classifying a battery in a non-destructive way according to the type of negative electrode material and the state of the battery. Furthermore, the battery classification apparatus 100 has an advantage of more specifically classifying the battery into a reusable battery or a non-reusable battery.

For example, a battery installed in an electric vehicle deteriorates its performance when it is driven for about 200,000 km or more, and it is classified as a waste battery and needs to be replaced. However, since such a waste battery has a high energy density, it is sufficiently applicable to other fields. In other words, the waste battery simply cannot show its maximum performance just when applied to an electric vehicle, and if it is used in secondary and tertiary applications such as ESS (Energy storage system) that is not frequently charged and discharged and requires high energy density compared to electric vehicles, it can be reused for the remainder of its lifespan. In addition, if the waste battery is disposed of without being reused secondly or tertiarily, it may adversely affect the environment in terms of pollution.

Therefore, since a reusable battery can be classified in a non-destructive way by the battery classification apparatus 100 according to an embodiment of the present disclosure, the production cost of the battery may be reduced according to the reuse and recycling of the waste battery, and there is a great advantage in that the environmental contamination can be minimized.

Meanwhile, the control unit 120 provided in the battery classification apparatus 100 may selectively include processors known in the art, application-specific integrated circuit (ASIC), other chipsets, logic circuits, registers, communication modems, data processing devices, and the like to execute various control logic performed in the present disclosure. Also, when the control logic is implemented in software, the control unit 120 may be implemented as a set of program modules. At this time, the program module may be stored in a memory and executed by the control unit 120. The memory may be located inside or out of the control unit 120 and may be connected to the control unit 120 by various well-known means.

In addition, the battery classification apparatus 100 may further include a storage unit 130. The storage unit 130 may store data necessary for operation and function of each component of the battery classification apparatus 100, data generated in the process of performing the operation or function, or the like. The storage unit 130 is not particularly limited in its kind as long as it is a known information storage means that can record, erase, update and read data. As an example, the information storage means may include random access memory (RAM), flash memory, read-only memory (ROM), electrically erasable programmable read-only memory (EEPROM), registers, and the like. In addition, the storage unit 130 may store program codes in which processes executable by the control unit 120 are defined.

For example, the storage unit 130 may store the battery information representing a corresponding relationship between voltage and capacity of the battery. Also, the storage unit 130 may store the BOL battery information representing a corresponding relationship between voltage and capacity of the BOL battery. In addition, the profile generating unit 110 may access the storage unit 130 to obtain battery information, and generate a differential profile for the battery based on the obtained battery information.

In addition, the storage unit 130 may store the differential profile generated by the profile generating unit 110. The control unit 120 may directly receive the differential profile from the profile generating unit 110, and may access the storage unit 130 to obtain the stored differential profile. Also, the control unit 120 may access the storage unit 130 to obtain the battery information and the BOL battery information.

Hereinafter, an embodiment in which the control unit 120 divides the capacity region of the differential profile into a first capacity region RR1 and a second capacity region RR2 will be described.

The control unit 120 may be configured to set the first capacity region RR1 and the second capacity region RR2 based on a capacity at which a corresponding differential voltage is lowest in a predetermined capacity region RQ of the differential profile.

For example, in the embodiment of FIG. 2, the predetermined capacity region RQ may be preset to 0.3 to 0.5. In addition, the control unit 120 may set the first capacity region RR1 and the second capacity region RR2 based on the capacity corresponding to the lowest differential voltage in the predetermined capacity region RQ. That is, the control unit 120 may set a low capacity region and a high capacity region based on the capacity corresponding to the lowest differential voltage in the predetermined capacity region RQ.

Due to the characteristics of a battery containing a positive electrode material and a negative electrode material, the differential voltage in the low capacity region is relatively strongly affected by the negative electrode, and the differential voltage in the high capacity region is relatively strongly affected by the positive electrode. This is the same not only for the differential voltage, but also for the differential capacity that can be expressed as "dQ/dV".

The control unit 120 may judge whether the battery satisfies the first classification criterion based on the differential voltage of a plurality of peaks in the first capacity region RR1, which is relatively strongly affected by the negative electrode. Also, the control unit 120 may judge whether the battery satisfies the second classification criterion based on the differential voltage of a plurality of peaks in the second capacity region RR2, which is relatively strongly affected by the positive electrode. That is, the control unit 120 may improve the accuracy and reliability of battery classification by judging whether the battery satisfies the first classification criterion and the second classification criterion, respectively, in consideration of the characteristics of the battery according to the capacity region.

Hereinafter, an embodiment in which the control unit 120 sets the criterion value R serving as a criterion for judging whether the first classification criterion is satisfied and whether the second classification criterion is satisfied will be described.

The control unit 120 may be configured to select a peak at which the corresponding differential voltage is greatest among the plurality of peaks as a target peak.

Here, the control unit 120 may select the target peak in the entire capacity region of the battery, unlike the embodiment in which the first capacity region RR1 and the second capacity region RR2 are set. For example, in the embodiment of FIG. 2, the third peak P3 having the greatest differential voltage may be determined as the target peak TP1.

The control unit 120 may be configured to determine a first differential voltage R1 based on the differential voltage of the selected target peak.

Specifically, the control unit 120 may be configured to determine a value smaller than the differential voltage of the target peak by a first reference value r1 as the first differential voltage R1.

For example, in the embodiment of FIG. 2, the differential voltage of the target peak TP1 may be d3. The control unit 120 may determine a value smaller than the differential voltage d3 of the target peak TP1 by the first reference value r1 as the first differential voltage R1.

The control unit 120 may be configured to determine a second differential voltage R2 based on the lowest differential voltage L of the differential profile.

Specifically, the control unit 120 may be configured to determine a value greater than the lowest differential voltage L by a second reference value r2 as the second differential voltage R2.

For example, in the embodiment of FIG. 2, the lowest differential voltage L of the differential profile may be L. The control unit 120 may determine a value greater than the lowest differential voltage L by the second reference value r2 as the second differential voltage R2.

The control unit 120 may be configured to set a greater value of the first differential voltage R1 and the second differential voltage R2 as the criterion value R.

For example, in the embodiment of FIG. 2, since the first differential voltage R1 is greater than the second differential voltage R2, the first differential voltage R1 may be set as the criterion value R.

In general, since the non-graphite-based negative electrode active material that can be contained in the negative electrode material of the battery exhibits capacity in the low capacity region, it may have greater hysteresis for resistance and OCV (Open Circuit Voltage) and low charging/discharging efficiency, compared to graphite. For example, silicon (ex. SiO) may be applied to the non-graphite-based negative electrode active material. According to the characteristics of the non-graphite-based negative electrode active material, a battery containing a non-graphite-based negative electrode material has a lower differential voltage in the low capacity region compared to a battery containing a graphite-based negative electrode material. Therefore, the control unit 120 may classify the battery more accurately by setting the criterion value R based on the greater value of the first differential voltage R1 and the second differential voltage R2.

Hereinafter, an embodiment for each of the plurality of differential profiles generated by the profile generating unit 110 will be described.

Figure 3:
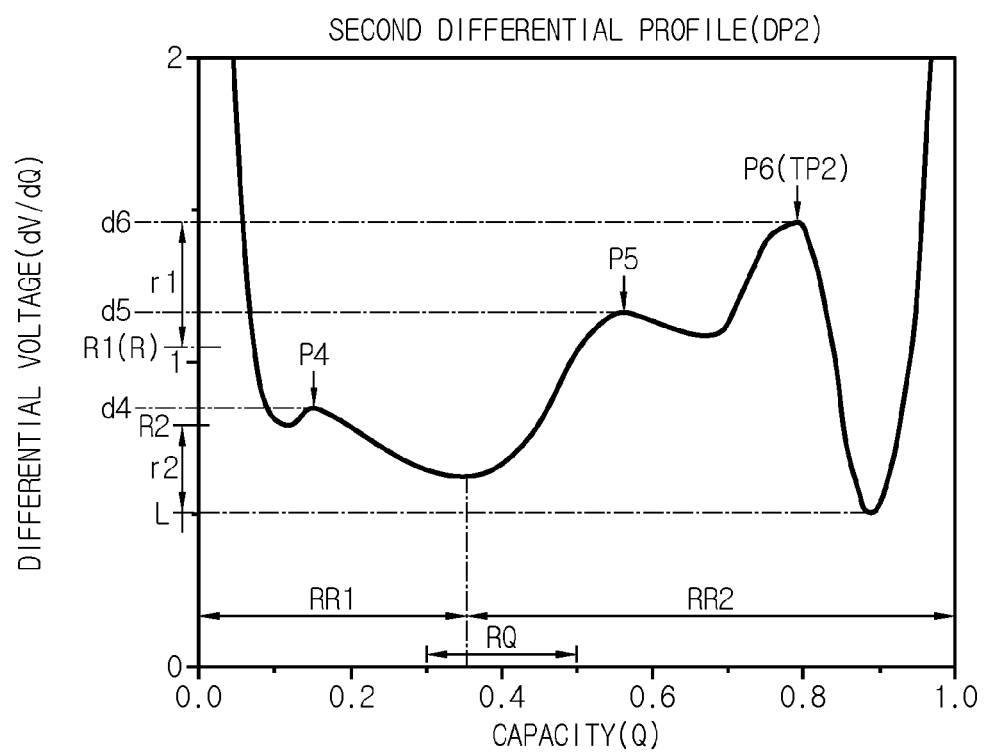
FIG. 3 is a diagram schematically showing a second differential profile according to an embodiment of the present disclosure.

FIG. 3 is a diagram schematically showing a second differential profile DP2 according to an embodiment of the present disclosure.

Specifically, the second differential profile DP2 is a differential profile for a battery containing an NMCO positive electrode material with a nickel content of 80% and a 100% non-graphite-based negative electrode material (SiO). In addition, the second differential profile DP2 is a differential profile generated based on the voltage and capacity of the battery obtained when the battery is charged at a temperature of 25° C. and at a 0.05 C-rate.

The control unit 120 may detect the fourth peak P4, the fifth peak P5, and the sixth peak P6 in the second differential profile DP2. In addition, the control unit 120 may determine the sixth peak P6 having the greatest differential voltage among the fourth peak P4, the fifth peak P5, and the sixth peak P6 as the target peak TP2.

The control unit 120 may determine a value smaller than the differential voltage d6 of the target peak TP2 by the first reference value r1 as the first differential voltage RE Also, the control unit 120 may determine a value greater than the lowest differential voltage L of the second differential profile DP2 by the second reference value r2 as the second differential voltage R2. Here, since the first differential voltage R1 is greater than the second differential voltage R2, the control unit 120 may set the first differential voltage R1 as the criterion value R.

Since the differential voltage d4 of the fourth peak P4 included in the first capacity region RR1 is smaller than the criterion value R, the control unit 120 may judge that the battery does not satisfy the first classification criterion.

In order for the battery to be classified into the first group, both the first classification criterion and the second classification criterion must be satisfied, so the control unit 120 may classify the battery into the second group without judging whether the battery satisfies the second classification criterion.

Preferably, since the control unit 120 may classify the battery according to the type of negative electrode material contained in the battery, it is possible to judge whether the battery satisfies the first classification criterion first, and then judge whether the battery satisfies the second classification criterion. This is because the differential voltage in the first capacity region RR1, which is a low capacity region, is more affected by the negative electrode than the positive electrode as described above.

In addition, the control unit 120 may classify that the battery is a battery containing a non-graphite-based negative electrode material or an EOL battery containing a graphite-based negative electrode material, and is a non-reusable battery.

Figure 4:
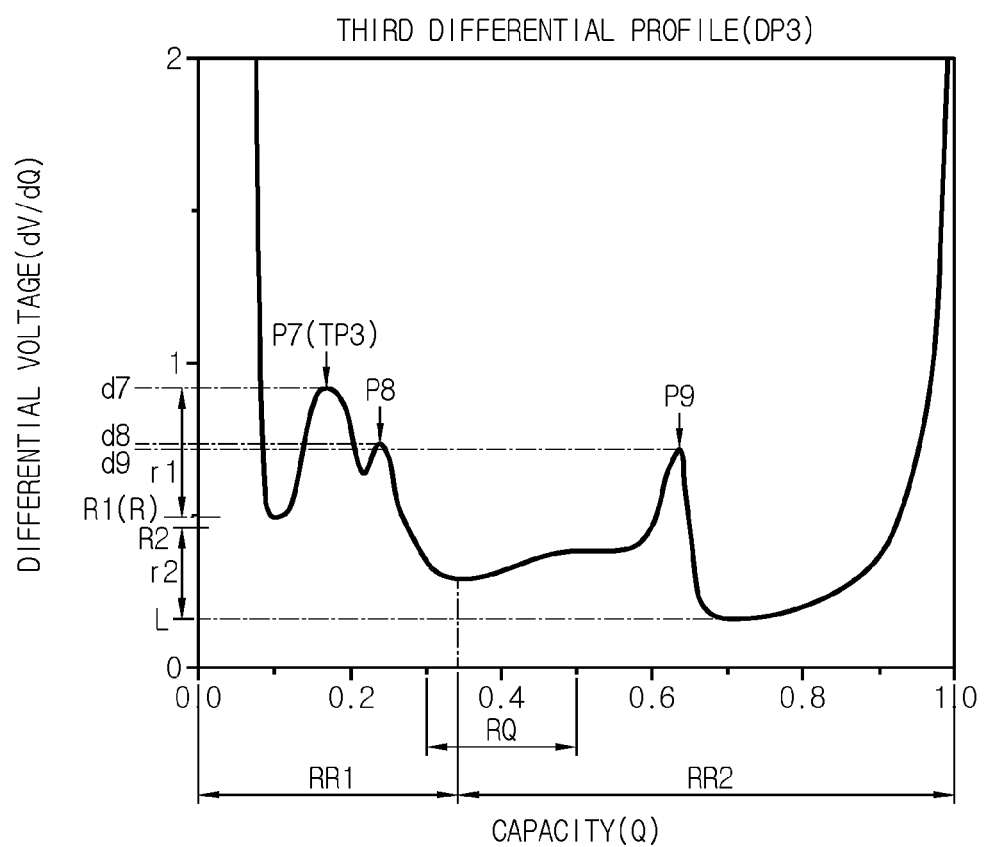
FIG. 4 is a diagram schematically showing a third differential profile according to an embodiment of the present disclosure.

FIG. 4 is a diagram schematically showing a third differential profile DP3 according to an embodiment of the present disclosure.

Specifically, the third differential profile DP3 is a differential profile for a battery containing an LMO (lithium manganese oxide) positive electrode material and a 100% graphite-based negative electrode material. In addition, the third differential profile DP3 is a differential profile generated based on the voltage and capacity of the battery obtained when the battery is charged at a temperature of 25° C. and at a 0.05 C-rate.

The control unit 120 may detect the seventh peak P7, the eighth peak P8 and the ninth peak P9 in the third differential profile DP3. In addition, the control unit 120 may determine the seventh peak P7 having the greatest differential voltage among the seventh peak P7, the eighth peak P8, and the ninth peak P9 as the target peak TP3.

The control unit 120 may determine a value smaller than the differential voltage d7 of the target peak TP3 by the first reference value r1 as the first differential voltage R1. Also, the control unit 120 may determine a value greater than the lowest differential voltage L of the third differential profile DP3 by the second reference value r2 as the second differential voltage R2. Here, since the first differential voltage R1 is greater than the second differential voltage R2, the control unit 120 may set the first differential voltage R1 as the criterion value R.

Since the differential voltage d7 of the seventh peak P7 and the differential voltage d8 of the eighth peak P8 included in the first capacity region RR1 are greater than the criterion value R, the control unit 120 may judge that the battery satisfies the first classification criterion.

In addition, since the differential voltage d9 of the ninth peak P9 included in the second capacity region RR2 is greater than the criterion value R, the control unit 120 may judge that the battery satisfies the second classification criterion.

Since the battery is judged to satisfy both the first classification criterion and the second classification criterion, the control unit 120 may classify the battery into the first group. In addition, the control unit 120 may classify that the battery is a BOL battery or a MOL battery containing 100% graphite-based negative electrode material, and is a reusable battery.

Figure 5:
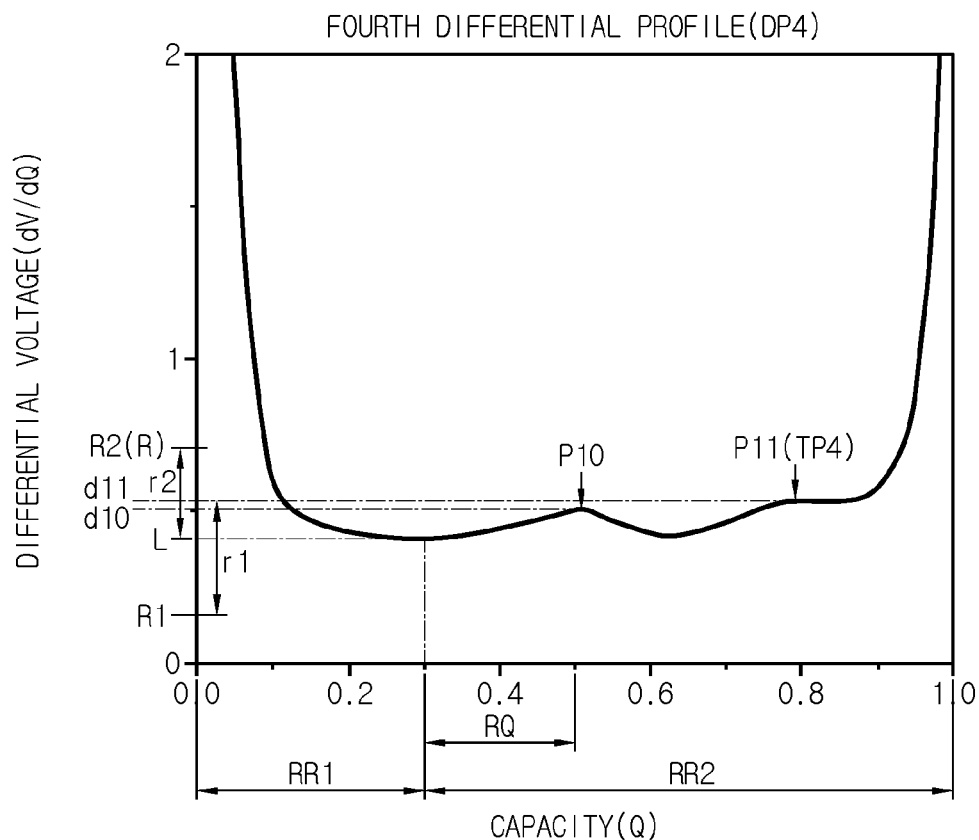
FIG. 5 is a diagram schematically showing a fourth differential profile according to an embodiment of the present disclosure.

FIG. 5 is a diagram schematically showing a fourth differential profile DP4 according to an embodiment of the present disclosure.

Specifically, the fourth differential profile DP4 is a differential profile for a battery containing a LMO (lithium manganese oxide) positive electrode material and 100% non-graphite-based negative electrode material (SiO). In addition, the fourth differential profile DP4 is a differential profile generated based on the voltage and capacity of the battery obtained when the battery is charged at a temperature of 25° C. and at a 0.05 C-rate.

The control unit 120 may detect the tenth peak P10 and the eleventh peak P11 in the fourth differential profile DP4. In addition, the control unit 120 may determine the eleventh peak P11 having the greatest differential voltage among the tenth peak P10 and the eleventh peak P11 as the target peak TP4.

The control unit 120 may determine a value smaller than the differential voltage d11 of the target peak TP4 by the first reference value r1 as the first differential voltage R1. Also, the control unit 120 may determine a value greater than the lowest differential voltage L of the fourth differential profile DP4 by the second reference value r2 as the second differential voltage R2. Here, since the second differential voltage R2 is greater than the first differential voltage R1, the control unit 120 may set the second differential voltage R2 as the criterion value R.

Here, referring to the embodiments of FIGS. 2 to 5, it cannot be regarded that the first differential voltage R1 is always greater than the second differential voltage R2. Therefore, the control unit 120 sets the criterion value R by comparing the first differential voltage R1 determined based on the differential voltage of the target peak and the second differential voltage R2 determined based on the lowest differential voltage L with each other.

Since the first capacity region RR1 does not include any peak, the control unit 120 may judge that the battery does not satisfy the first classification criterion. Accordingly, the control unit 120 may classify the battery into the second group without judging whether the battery satisfies the second classification criterion.

In addition, the control unit 120 may classify the battery as a battery containing a non-graphite-based negative electrode material or an EOL battery containing a graphite-based negative electrode material, and is a non-reusable battery.

The battery classification apparatus 100 according to the present disclosure may be applied to a BMS (Battery Management System). That is, the BMS according to the present disclosure may include the battery classification apparatus 100 described above. In this configuration, at least some of the components of the battery classification apparatus 100 may be implemented by supplementing or adding functions of the configuration included in the conventional BMS. For example, the profile generating unit 110, the control unit 120 and the storage unit 130 of the battery classification apparatus 100 may be implemented as components of the BMS.

In addition, the battery classification apparatus 100 according to the present disclosure may be provided in a battery pack. That is, the battery pack according to the present disclosure may include the above-described battery classification apparatus 100 and one or more battery cells. In addition, the battery pack may further include electrical equipment (relays, fuses, etc.) and a case.

Figure 6:
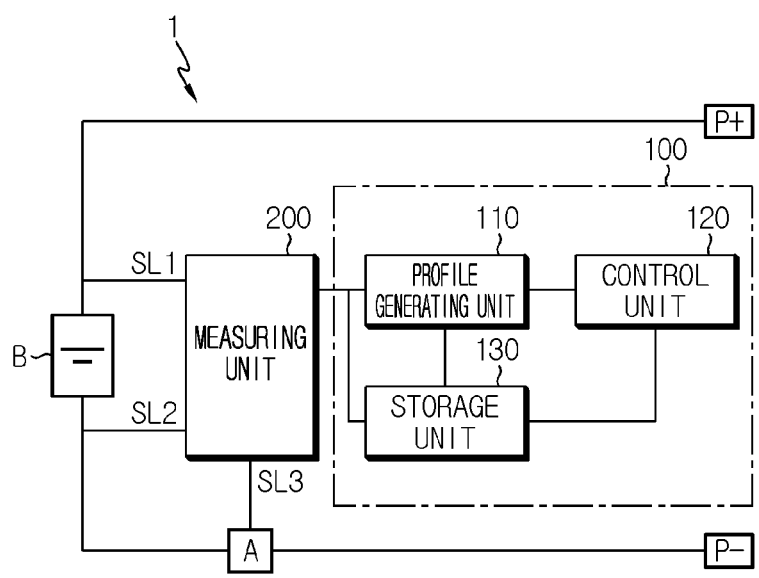
FIG. 6 is a diagram schematically showing an exemplary configuration of a battery pack according to another embodiment of the present disclosure.

FIG. 6 is a diagram schematically showing an exemplary configuration of a battery pack 1 according to another embodiment of the present disclosure.

A measuring unit 200 may be connected to a first sensing line SL1, a second sensing line SL2, and a third sensing line SL3.

Specifically, the first sensing line SL1 may be connected to a positive electrode of a battery cell B and the measuring unit 200. Also, the second sensing line SL2 may be connected to a negative electrode of the battery cell B and the measuring unit 200. The measuring unit 200 may measure the voltage of the battery cell B by calculating the difference between the positive electrode voltage of the battery cell B measured through the first sensing line SL1 and the negative electrode voltage of the battery cell B measured through the second sensing line SL2.

Also, the measuring unit 200 may measure the charging current and/or the discharging current of the battery cell B through an ampere meter A connected to the third sensing line SL3. For example, the ampere meter A may be a shunt resistor or an ammeter.

The battery information about the voltage and current of the battery cell B measured by the measuring unit 200 may be transmitted to the battery classification apparatus 100. Specifically, the profile generating unit 110 may receive the battery information of the battery cell B from the measuring unit 200. In addition, the profile generating unit 110 may generate a differential profile representing a corresponding relationship between the capacity of the battery cell B and the differential voltage based on the received voltage and current of the battery cell B. In addition, the battery information of the battery cell B measured by the measuring unit 200 may be stored in the storage unit 130.

FIG. 7 is a diagram schematically showing a battery classification method according to still another embodiment of the present disclosure.

Preferably, each step of the battery classification method may be performed by the battery classification apparatus 100. Hereinafter, contents overlapping with the previously described contents will be omitted or briefly described.

Referring to FIG. 7, the battery classification method may include a differential profile generating step (S100), a plural peak detecting step (S200), and a battery classifying step (S300).

The differential profile generating step (S100) is a step of generating a differential profile representing a corresponding relationship between a differential voltage based on capacity and voltage of a battery and the capacity, and may be performed by the profile generating unit 110.

For example, in the embodiment of FIG. 2, the profile generating unit 110 may generate a first differential profile DP1 representing a corresponding relationship between the capacity of the battery and the differential voltage.

The plural peak detecting step S200 is a step of detecting a plurality of peaks in the differential profile, and may be performed by the control unit 120.

For example, in the embodiment of FIG. 2, the control unit 120 may detect a first peak P1, a second peak P2, a third peak P3, and a fourth peak P4.

The battery classifying step (S300) is a step of classifying the battery into any one of a plurality of groups preset based on a plurality of classification conditions preset for the number of the plurality of detected peaks and differential voltage, and may be performed by the control unit 120.

Specifically, the control unit 120 may judge whether the battery satisfies the first classification condition based on the number of peaks included in the first capacity region RR1 and the differential voltage. In addition, the control unit 120 may judge whether the battery satisfies the second classification condition based on the number of peaks included in the second capacity region RR2 and the differential voltage.

For example, in the embodiment of FIG. 2, the first peak P1 and the second peak P2 may be included in the first capacity region RR1, and the third peak P3 and the fourth peak P4 may be included in the second capacity region RR2. Since the differential voltage d1 of the first peak P1 and the differential voltage d2 of the second peak P2 are equal to or greater than the criterion value R, the control unit 120 may judge that the battery satisfies the first classification condition. In addition, since the differential voltage d3 of the third peak P3 and the differential voltage d4 of the fourth peak P4 are also equal to or greater than the criterion value R, the control unit 120 may judge that the battery satisfies the second classification condition. Accordingly, the control unit 120 may classify the battery into the first group. In addition, the control unit 120 may classify that the battery is a BOL battery or a MOL battery containing a graphite-based negative electrode material, and is a reusable battery.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
100: battery classification apparatus
110: profile generating unit
120: control unit
130: storage unit
200: measuring unit

What is claimed is:

1. A battery classification apparatus, comprising:
a controller; and
memory having programmed thereon instructions that, when executed, are configured to cause the processor to:
obtain a differential profile representing a relationship between a capacity of a battery and a differential voltage of the battery;
detect a plurality of peaks in the obtained differential profile;
determine whether the battery satisfies one or more of a plurality of preset classification conditions, wherein for each classification condition, satisfying the classification condition is based on a number of detected peaks in the obtained differential profile and the differential voltage associated with each detected peak; and
classify the battery into any one of a plurality of preset groups based on the preset classification conditions satisfied by the battery.

2. The battery classification apparatus according to claim 1,
wherein the plurality of classification conditions include:
a first classification condition about whether any of the plurality of peaks in a first capacity region of the differential profile is associated with a differential voltage that is equal to or greater than a threshold value; and
a second classification condition about whether any of the plurality of peaks in a second capacity region of the differential profile is associated with a differential voltage that is equal to or greater than the threshold value.

3. The battery classification apparatus according to claim 2,
wherein the first capacity region and the second capacity region are based on a capacity at which a corresponding differential voltage is lowest within a predetermined capacity region of the differential profile.

4. The battery classification apparatus according to claim 2,
wherein the instructions are configured to cause the controller to:
determine a target peak from among the plurality of peaks at which the differential voltage is greatest;
determine a first differential voltage based on the differential voltage of the determined target peak;
determine a second differential voltage based on a lowest differential voltage of the differential profile; and
set the threshold value to a greater one of (i) the first differential voltage or (ii) the second differential voltage.

5. The battery classification apparatus according to claim 4,
wherein the first differential voltage is smaller than the differential voltage of the target peak by a first reference value and the second differential voltage is greater than the lowest differential voltage by a second reference value.

6. The battery classification apparatus according to claim 2,
wherein the instructions are configured to cause the controller to:
classify the battery into a first group in response to the battery satisfying both the first classification condition and the second classification condition; and
classify the battery into a second group in response to the battery not satisfying at least one of the first classification condition and the second classification condition.

7. The battery classification apparatus according to claim 6,
wherein the instructions are configured to cause the controller to:
determine that the battery is a beginning of life (BOL) battery containing a graphite-based negative electrode material or a middle of life (MOL) battery containing a graphite-based negative electrode material based on classification of the battery into the first group; and
determine that the battery is a battery containing a non-graphite-based negative electrode material or an end of life (EOL) battery containing a graphite-based negative electrode material based on classification of the battery into the second group.

8. The battery classification apparatus according to claim 7,
wherein the instructions are configured to cause the controller to:
determine that the battery is a reusable battery based on classification of the battery into the first group; and
determine that the battery is a non-reusable battery based on classification of the battery into the second group.

9. A battery pack, comprising the battery classification apparatus according to claim 1.

10. A battery classification method, comprising:
obtaining, by a controller, a differential profile representing a corresponding relationship between a differential voltage of a battery and a capacity of the battery;
detecting, by the controller, a plurality of peaks in the differential profile; and
determining, by the controller, whether the battery satisfies one or more of a plurality of preset classification conditions, wherein for each classification condition, satisfying the classification condition is based on number of detected peaks in the obtained differential profile and the differential voltage associated with each detected peak; and
classifying, by the controller, the battery into any one of a plurality of preset groups based on the preset classification conditions satisfied by the battery.

* * * * *